(12) United States Patent
Nagata et al.

(10) Patent No.: US 6,831,528 B2
(45) Date of Patent: Dec. 14, 2004

(54) HIGH-FREQUENCY SWITCHING MODULE AND HIGH-FREQUENCY APPARATUS EQUIPPED WITH THE SAME

(75) Inventors: Yasushi Nagata, Soraku-gun (JP); Tomoyuki Iwasaki, Joyo (JP); Yuki Sato, Osaka (JP); Mitsuru Miyake, Minamikawachi-gun (JP); Takeo Yasuho, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/026,459

(22) Filed: Dec. 27, 2001

(65) Prior Publication Data

US 2002/0084868 A1 Jul. 4, 2002

(30) Foreign Application Priority Data

Dec. 28, 2000 (JP) ...................................... 2000-400404

(51) Int. Cl.$^7$ ............................... H01P 1/10; H01P 5/12
(52) U.S. Cl. ...................................... 333/101; 333/185
(58) Field of Search ............................... 333/101, 103, 333/132, 134, 185, 204

(56) References Cited

U.S. PATENT DOCUMENTS

| | | | |
|---|---|---|---|
| 5,336,855 A | 8/1994 | Kahlert et al. ............... 174/250 |
| 5,513,382 A | * 4/1996 | Agahi-Kesheh et al. ...... 455/83 |
| 5,783,976 A | 7/1998 | Furatani et al. ............. 333/134 |
| 5,796,169 A | 8/1998 | Dockerty et al. ........... 257/780 |
| 5,834,994 A | * 11/1998 | Shapiro ....................... 333/202 |
| 5,952,709 A | 9/1999 | Kitazawa et al. ........... 257/664 |
| 5,985,414 A | 11/1999 | Fukuda et al. .............. 428/192 |
| 5,990,732 A | 11/1999 | Furutani et al. ............. 327/565 |
| 6,034,571 A | 3/2000 | Uno ............................ 331/67 |
| 6,137,062 A | * 10/2000 | Zimmerman ................ 174/260 |
| 6,445,262 B1 | * 9/2002 | Tanaka et al. .............. 333/133 |
| 6,456,172 B1 | * 9/2002 | Ishizaki et al. ............. 333/133 |

FOREIGN PATENT DOCUMENTS

| | | | |
|---|---|---|---|
| EP | 0704925 | 4/1996 | ............. H01P/3/08 |
| EP | 0785590 | 7/1997 | ............. H01P/1/15 |
| EP | 0910163 | 4/1999 | ............. H03B/1/04 |
| EP | 0921642 | 6/1999 | ............. H04B/1/40 |
| EP | 0977298 | 2/2000 | ............. H01P/1/04 |
| JP | 61293097 | 12/1986 | ........... H04R/17/00 |
| JP | 5-74644 | 3/1993 | .......... H01G/1/035 |
| JP | 6-349679 | 12/1994 | ............ H01G/4/42 |
| JP | 7-205502 | 8/1995 | ............. H01P/1/15 |
| JP | 8-17676 | 1/1996 | ............ H01G/4/30 |
| JP | 8-162801 | 6/1996 | ............. H01P/1/15 |
| JP | 9-129447 | 5/1997 | .......... H01F/17/00 |
| JP | 9-200077 | 7/1997 | ............ H04B/1/44 |
| JP | 9-260901 | 10/1997 | ............. H01P/1/15 |
| JP | 11103229 | 4/1999 | .......... H03H/7/075 |
| JP | 11225088 | 8/1999 | ............ H04B/1/50 |

OTHER PUBLICATIONS

English Language Abstract of JP 7–205502.

(List continued on next page.)

Primary Examiner—Robert Pascal
Assistant Examiner—Dean Takaoka
(74) Attorney, Agent, or Firm—Greenblum & Bernstein, P.L.C.

(57) ABSTRACT

In a high-frequency switching module for use mainly in a communications apparatus and a high-frequency apparatus equipped with the same, the high-frequency switching module has a group of high-frequency terminals provided on the mounting side surface of a multi-layer assembly of which the lateral sides are formed as no-electrode provided sides excluding the high-frequency terminals. Thus, the high-frequency switching module and the high-frequency apparatus equipped with the same are less susceptible to the external effect.

7 Claims, 5 Drawing Sheets

OTHER PUBLICATIONS

English Language Abstract of JP 9–260901.
English Language Abstract of JP 8–162801.
English Language Abstract of JP 11–103229.
English Language Abstract of JP 5–74644.
English Language Abstract of JP 6–349679.
English Language Abstract of JP 8–17676.
English Language Abstract of JP 61–293097.
English Language Abstract of JP 9–129447.

* cited by examiner

HIGH-FREQUENCY SWITCHING MODULE AND HIGH-FREQUENCY APPARATUS EQUIPPED WITH THE SAME

BACKGROUND OF THE INVENTION

1. Field of the Invention

The present invention relates to a high-frequency switching module for use primarily in a communications equipment and a high-frequency apparatus equipped with the same.

2. Description of the Prior Art

Conventionally, a multi-layer high-frequency switching module has a structure of a multi-layer assembly 1 formed of a dielectric material as shown in FIG. 10. The multi-layer assembly 1 has circuit electrodes (not shown) patterned therein and some high-frequency terminals 2 provided on sides thereof, and the high-frequency terminals 2 are connected to corresponding circuit electrodes and serve as input and output ports for high-frequency signals.

However, while a high-frequency apparatus such as a mobile telephone has significantly been minimized in overall size, a high-frequency switching module used therein is generally operated at such a high operating frequency as ranging from some hundreds MHz to some GHz, Therefore, in a structure of the high-frequency terminals 2 provided on the sides of the multi-layer assembly 1 designed as the input and output ports for high-frequency signals, the high-frequency terminals 2 act as an antenna and are highly susceptible to effects of the other neighbor components of higher density provided in the down-sized high-frequency apparatus.

Moreover, in a conventional electrode pattern construction in which high-frequency terminals are connected to circuit electrodes, there has been a problem that improvement in high-frequency characteristics of a high-frequency switching module is suppressed.

SUMMARY OF THE INVENTION

The present invention has been developed to solve these problems and has an essential object to provide a high-frequency switching module effectively avoiding the external effects and to provide a high-frequency apparatus equipped with the same.

Another object of the present invention is to provide a high-frequency switching module having improved high-frequency characteristics in which a transmission loss is reduced in the connecting construction between the high-frequency terminals and the circuit electrodes.

In order to achieve the objects mentioned above, the present invention provides a high-frequency switching module of a multi-layer assembly which is to be mounted on a circuit board of a high-frequency apparatus. In specific, high-frequency terminals are provided on a bottom surface of the multi-layer assembly where the bottom surface corresponds to a mounting side surface when mounted on a circuit board of a high-frequency apparatus while side surfaces of the multi-layer assembly are used as no-electrode provided sides.

The high-frequency switching module of the present invention is primarily includes a switching circuit and a filtering circuit, which comprises: a multi-layer assembly having a plurality of dielectric sheets of layers placed one over the other; and a plurality of high-frequency terminals provided on outer surfaces of the multi-layer assembly. The switching circuit is formed in the layers of the multi-layer assembly, having one end thereof connected to a first high-frequency terminal of the plurality of high-frequency terminals.

The filtering circuit is formed in the layers of the multi-layer assembly, having one end thereof connected to the other end of the switching circuit, and the other end connected to a second high-frequency terminal of the plurality of high-frequency terminals. In this construction, the high-frequency terminals are provided on a mounting side surface of the multi-layer assembly while lateral sides of the multi-layer assembly are not provided with any electrode for the high-frequency terminals.

By this arrangement, the high-frequency terminals acting as an antenna in a high frequency range are provided on the bottom side of the multi-layer assembly and the lateral sides thereof are not provided with any high-frequency terminal. Thus, the high-frequency terminals are hardly be affected by the effects of the other neighbor components.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which.

DETAILED DESCRIPTION OF THE PREFERRED EMBODIMENTS

Figure 1:
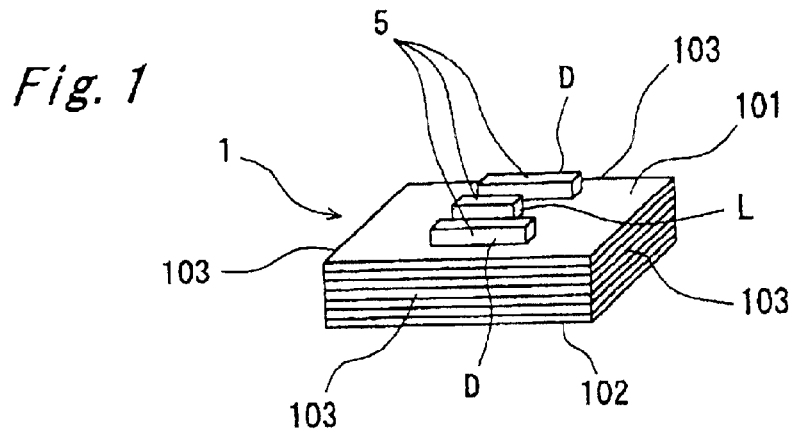
FIG. 1 is a perspective view of a high-frequency switching module according to one embodiment of the present invention.

Before the description proceeds, it is to be noted that, since the basic structures of the preferred embodiments are in common, like parts are designated by the same reference numerals throughout the accompanying drawings.

Preferred embodiments of the present invention will be described below referring to the accompanying drawings.

FIG. 1 is a perspective view of a high-frequency switching module which is commonly used as an RF (radio-frequency) unit in a high-frequency apparatus such as a mobile telephone.

Figure 2A:
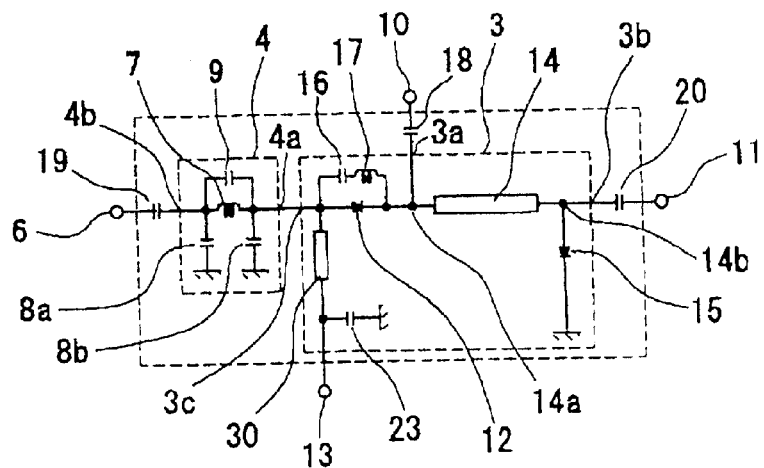
FIGS. 2A and 2B are equivalent circuit diagrams of the high-frequency switching modules according to the present invention.

The high-frequency switching module has a structure of a multi-layer assembly 1 formed of a dielectric material. The multi-layer assembly 1 is provided with circuit electrodes which are patterned (e.g., provided) inside thereof for serving as a switching circuit 3 and a filtering circuit 4 as shown in FIG. 2A (or FIG. 2B). Also, circuit components 5 including diodes, capacitors, and inductors are mounted on the top side 101 of the multi-layer assembly 1 to form parts of the switching circuit 3 and filtering circuit 4.

The circuit components 5 mounted on the top side of the multi-layer assembly 1 are members not buildable insidde the multi-layer assembly 1, members buildable but not reducible in size due to large parameters of elements thereof. In the present embodiment, as the circuit components 5 mounted on the top side of the multi-layer assembly 1, only diodes (D) and chip inductor (L) are used.

By this arrangement, the circuit components 5 which can hardly be built in the multi-layer assembly 1 or hardly be reduced in size due to their parameters, or hardly preventing noise effects, are mounted on the top side of the multi-layer assembly 1. Thus, the high-frequency module can be provided in a one-chip form and down-sized totally. The circuit components 5 mounted on the top side of the multi-layer assembly 1 of this embodiment are illustrated using only diodes and chip inductors but the present invention is not limited to this arrangement, and other components such as a capacitor may be provided on the top side 101.

Referring to FIG. 2A, the filtering circuit 4 is provided for eliminating harmonic components from a signal output of such as an amplifier circuit (not shown) connected at a rear stage of the high-frequency switching module and is arranged in a form of a π type low-pass filter. In specific, the filtering circuit 4 includes a coil 7 connected between the switching circuit 3 and a transmission port 6, that is, the coil 7 is connected between one terminal 4a and the other terminal 4b of the filtering circuit 4 where the both ends of the coil 7 (i.e., terminals 4a and 4b) are connected to the earth (GRN) via capacitors 8b and 8a, respectively. Also, the coil 7 is connected in parallel with a capacitor 9, so that the combination of the coil 7 and the capacitor 9 can act a parallel oscillation unit or resonance circuit, thus ensuring an attenuation in a required frequency range.

The switching circuit 3 is arranged in a form of a single-port-double-terminal (SPDT) type high-frequency switch which has a first terminal 3a connected to an antenna port 10 via a capacitor 18, a second terminal 3b connected to a reception port 11 via a capacitor 20 and a third terminal 3c connected to the transmission port 6 via the filtering circuit 4 and a capacitor 19. By this arrangement, the switching circuit 3 selectively connects either the transmission port 6 or the reception port 11 to the antenna port 10 via the third terminal 3c or second terminal 3b, respectively.

More specifically, the switching circuit 3 comprises a diode 12, a strip line 14, a diode 15, a resonance circuit which is a combination of a capacitor 16 and a coil 17 serially connected thereto, a strip line 30 connected to a control port 13, and a capacitor 23.

The diode 12 has its anode connected to the third terminal 3c to the side of the transmission port 6 and its cathode connected to the first terminal 3a to the side of the antenna port 10, and the control port 13 is connected to the anode side of the diode 12. The strip line 14 has its one end 14a connected between the diode 12 and the antenna port 10 and the other end 14b connected to the side of the reception port 11 to thereby provide substantially a ¼ wavelength frequency of the transmission frequency. The diode 15 has its anode connected to the other end 4b of the strip line 14 connected to the side of the reception port 11 and its cathode connected to the ground.

By this arrangement of the switching circuit 3, when in a signal transmission mode, a control voltage is supplied to the diodes 12 and 15 via the control port 13 so that the diodes 12 and 15 to are energized to be a through state. Thus, the connecting state between the transmission port 6 and the antenna port 10 is closed (ON) while the reception port 11 side (i.e., the other end 14b) of the strip line 14 is connected to the ground. This causes the reception port 11 to be in an open state from the antenna port 10. Thus, it is permitted to transfer an input signal from the transmission port 6 to the antenna port 10 to output the signal efficiently.

When in a signal reception mode, the two diodes 12 and 15 are not energized with the control voltage signal from the control port 13 but remain in an open state, thus disconnecting between the antenna port 10 and the transmission port 6. This allows a signal received at the antenna port 10 to be transferred to the reception port 11 efficiently. Simultaneously, the oscillation circuit comprised of the capacitor 16 and the coil 17 which are connected in parallel with the diode 12, can attenuate the effect of an inter-port capacitance of the diode 12 developed in the reception mode.

Also, the capacitors 18, 19, and 20 provided at the antenna port 10, the transmission port 6, and the reception port 11 respectively can also cut DC artifacts of the control voltage supplied via the control port 13.

For fabricating a multi-layer assembly 1 of the high-frequency switching module shown in FIG. 1, inner layers of dielectric sheets 1a to 1k each having a rectangular shape are laminated one over the other to build various patterns of circuit electrodes in and on the multi-layer assembly. The patterns of the circuit electrodes will be explained later in more detail. On the bottom side 102 of the multi-layer assembly 1, that is, on the mounting side of the multi-layer high-frequency switching module, there are provided a group of terminals corresponding to the circuit electrodes or ports shown in FIG. 2A.

The terminals include an antenna terminal 10a acting as the antenna port 10, a transmission terminal 6a acting as the transmission port 6, a reception terminal 11c acting as the reception port 11, a control terminal 13a acting as the control port 13, and one or more grounding terminals 19a for grounding, as shown in FIG. 4. In this embodiment shown in FIG. 4, although there are provided four grounding terminals 19a, it is not limited to this and at least one common grounding terminal may be sufficient.

Returning back to FIG. 3, the dielectric sheets 1a and 1c have grounding electrodes 20a and 20b provided respectively on substantially the entire surfaces thereof. The dielectric sheet 1f has a grounding electrode 20c provided on a right half of the surface thereof. The grounding electrodes 20a, 20b, and 20c are connected through via-holes (VH) respectively to the grounding terminals 19a shown in FIG. 4A.

The dielectric sheet 1b has capacitor electrodes 21a, 22a, and 22b provided thereon for grounding. As the capacitor electrodes 21a, 22a, and 22b face the corresponding grounding electrodes 20a and 20b respectively provided on the dielectric sheets 1a and 1c, the capacitor electrode 21a is connected at one end through a via-hole to the control terminal 13a shown in FIG. 4, hence forming the capacitor 23 shown in FIG. 2.

The capacitor electrode 22a is connected at one end through a via-hole to the transmission terminal 6a shown in FIG. 4, hence forming the capacitor 8a shown in FIG. 2. The capacitor electrode 22b is connected at one end through a via-hole to one end of a coil electrode 24 provided on the dielectric sheet 1d, which will be explained later in more detail, hence forming the capacitor 8b shown in FIG. 2.

Figure 4A:
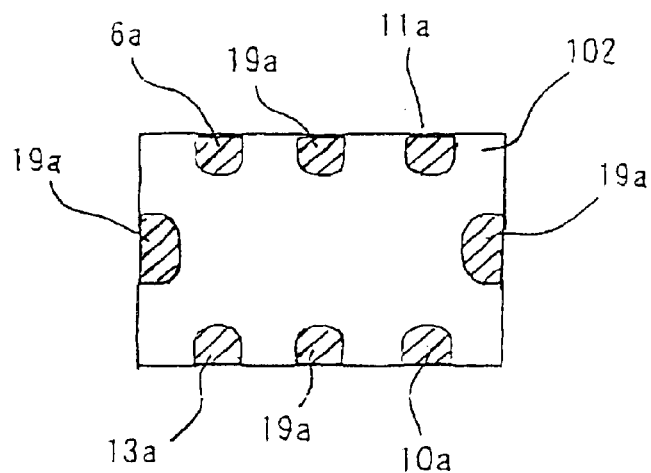
FIG. 4A is a bottom view of the high-frequency switching module according to the present invention.
Figure 4B:
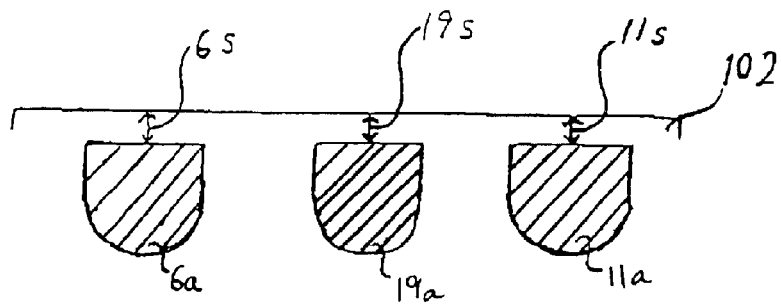
FIG. 4B is an enlarged view of a portion of the bottom view of the high-frequency switching module shown in FIG. 4A.

On the dielectric sheet 1d, the coil electrode 24 and a strip line electrode 25a are provided, and the coil electrode 24 is connected at one end through a via-hole to the transmission terminal 6a shown in FIG. 4A, hence forming the coil 7 shown in FIG. 2. The strip line electrode 25a is connected at one end through a via-hole to the reception terminal 11a shown in FIG. 4A, thus forming a part of the strip line 14 shown in FIG 2.

The dielectric sheet 1e has a strip line electrode 25b and a capacitor electrode 26a provided thereon and the strip line electrode 25b is connected at one end through a via-hole to the strip line 25a, thus forming the remaining of the strip line 14 shown in FIG. 2. Also, the capacitor electrode 26a is provided at the left of the strip line electrode 25b and is connected through a via-hole to the other end of the coil electrode 24a.

The dielectric sheets 1f, 1g, and 1h have capacitor electrodes 27a, 28a, and 29a provided at the left half thereof respectively. The capacitor electrode 28a is located opposite to the capacitor electrodes 27a and 29a, hence forming the capacitor 16 shown in FIG. 2. The capacitor electrode 27 is located opposite to the capacitor electrode 26a, hence forming the capacitor 9 shown in FIG. 2.

The dielectric sheet 1i has a strip line electrode 31a provided thereon and connected at one end to the control terminal 13a, thus forming the strip line 30 extending between the control port 13 and the diode 12 shown in FIG. 2.

The dielectric sheet 1k has a mount electrode 32a provided thereon for providing a chip diode (D) and a mount electrode 33a provided thereon for providing a chip inductor (L), serving as one of the circuit components 5. The mount electrodes 32a and 33a are connected to the corresponding circuit electrodes via connecting electrodes 34a provided on the dielectric sheet 1j. In this manner, the multi-layer type high-frequency switching module is fabricated in the present embodiment.

While the strip line 14 and strip line 30 are implemented as the strip line electrodes 25a and 25b and the strip line electrode 31a, respectively, in the multi-layer assembly 1 in the embodiment, it is not limited to this and the parts of the strip line electrodes may be located at the outside of the multi-layer assembly 1 or on the side of a mother board of the high-frequency apparatus (not shown)on which the multi-layer assembly 1 is mounted. This allows the electric length of the strip lines to be determined by trimming the total length of the strip line electrodes, hence facilitating adjustment of the circuit matching and significantly reducing the matching loss.

Preferably, for reducing the matching loss, it is advantageous to have the strip line 30, which extends between the control port 13 and the diode 12, provided one portion thereof in the multi-layer assembly 1 and the remaining thereof on the side of the mother board. This is because, the resonance (oscillation) circuit composed of the capacitor 16 and the coil 17 may adversely be affected by a total of the inter-terminal capacitance pertinent to the diode 12, floating capacitance developed between the mount electrodes 32a connected to the diode 12, floating capacitance developed between the patterned lines extending to the mount electrode 32a, in addition to a positional error of the diode 12 in relation to the mount electrodes 32a.

When the total capacitance is increased by 0.1 pF in a high-frequency range assigned to network communications with e.g. mobile telephones, the L value of the coil 17 may vary some in the unit of nH. Such a variation can be attenuated by trimming the length of the strip lines on the mother board. Accordingly, the method of trimming is highly effective for minimizing the declination in the high frequency properties.

Also, when the impedance ($Z_1$) in the strip lines provided on the multi-layer assembly 1 is determined smaller than the impedance ($Z_2$) in the strip lines provided on the mother board, the total electric length can be not greater than $\lambda/4$ and the pattern length in the multi-layer assembly can thus be minimized. As a result, the multi-layer assembly can be made easier in the pattern designing and decreased in the overall dimensions.

Figure 2B:
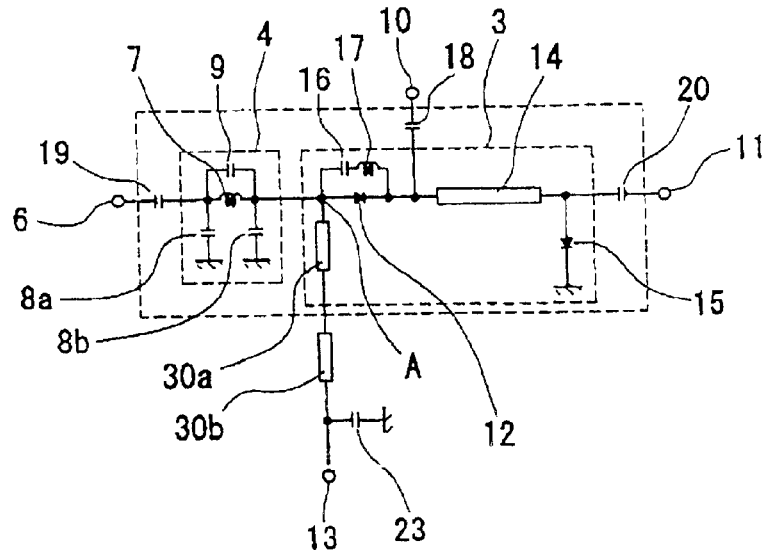

More particularly, as shown in FIG. 2B, when the characteristic impedance at the open end (adjacent to a point A in FIG. 2b) is declined, both the capacitance at the open end and the inductance at the short-circuit end can increase, thus minimizing the wavelength. In this arrangement shown in FIG. 2B, the strip line 30 connected between the control port 13 and the diode 12 shown in FIG. 2A is constructed of two strip lines 30a and 30b serially connected to each other.

As shown in FIG. 4A, the high-frequency terminals 2 including the antenna terminal 10a, transmission terminal 6a, and reception terminal 11a of the high-frequency switching module are provided on the bottom 102, i.e., mounting surface of the multi-layer assembly 1 onto a board of a high-frequency apparatus while the side surfaces 103 of the multi-layer assembly 1 shown in FIG. 1 are used as no-electrode provided sides.

By this arrangement, on the lateral sides of the multi-layer assembly 1 extending throughout the height, there is not provide with the high-frequency terminals 2 which may act as antennas at the high frequency range. Accordingly, the high-frequency switching module of this embodiment can ideally be reduced in the radiation loss and the parasitic impedance pertinent to the high-frequency terminals 2.

Moreover, as the high-frequency terminals 2 are provided only on the mounting side (i.e., bottom surface 102) of the multi-layer assembly 1, the high-frequency switching module when mounted on a printed circuit board of a high-frequency apparatus can be free from fillets of surface-mounting solder which are commonly applied on the lateral sides of the multi-layer, assembly 1 in the prior art.

Accordingly, the surface-mounting at a higher degree of density can be implemented. Moreover, when mounted onto the same printed circuit board, an undesired electromagnetic field induced interference or noise from any neighboring device can be successfully attenuated. As a result, the high-frequency switching module can be consistent in the performance.

It is also favorable for assigning the lateral sides 103 of the multi-layer assembly 1 as the no-electrode provided sides to connect the high-frequency terminals 2 to the corresponding circuit electrodes through the respective via-holes. This allows the multi-layer assembly 1 to be fabricated without using an intricate step. As the transmission loss at the via-holes is much smaller than that across the conventional electrode pattern, the frequency response of the high-frequency switching module can relatively be improved.

The top side 101 of the multi-layer assembly 1 on which the circuit components 5 are mounted is protected with a metallic shield cover (not shown) connected to the ground. The shield cover can maintain an appropriate degree of shielding at the location thereof.

While the high-frequency terminals 2 (the antenna terminal 2a, the transmission terminal 2b, and the reception terminal 2c) are not provided on the no-electrode provided sides 103 of the multi-layer assembly 1, the grounding electrode 20a (20b, 20c) provided on the dielectric sheet 1a (1c, 1e) can extend to the outer edge of the dielectric sheet 1a (1c, 1e), hence increasing the shielding effect for the multi-layer assembly 1.

Figure 3:
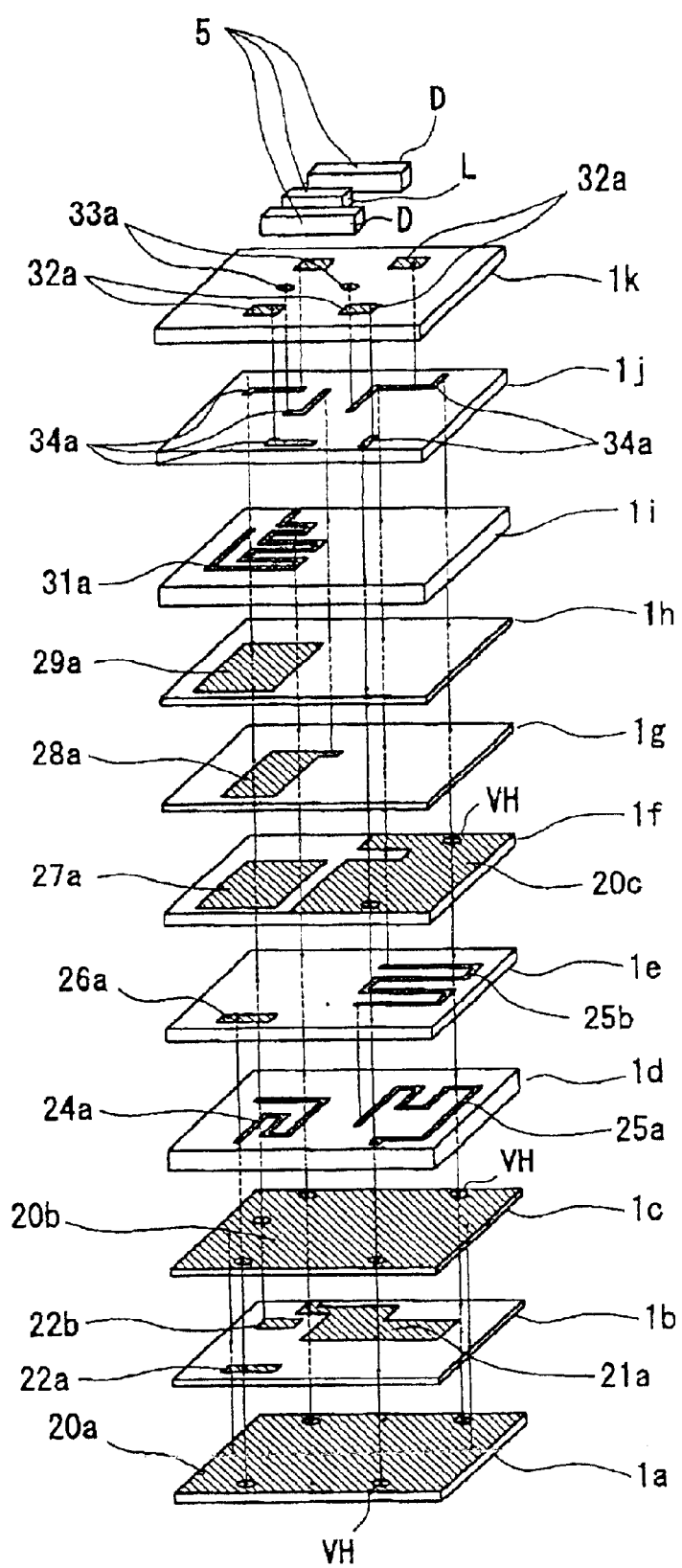
FIG. 3 is an exploded perspective view of the high-frequency switching module according to the present invention.
Figure 10:
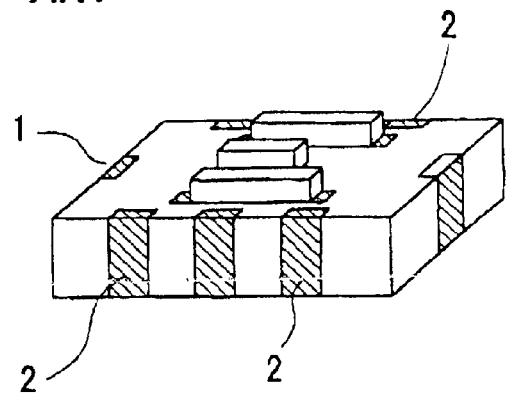
FIG. 10 is a perspective view of a conventional high-frequency switching module.

Whereas in the conventional construction shown in FIG. 10 in which the sides of the multi-layer assembly 1 are provided with the high-frequency terminals 2, for example, the grounding electrode 20a shown in FIG. 3 is possibly short-circuited with the high-frequency terminals 2 if the grounding electrode 20a is provided to extend to the edges of the dielectric sheet 1a of multi-layer assembly 1. In order to prevent the problematic short-circuit, it is not allowed in the conventional construction to extend the grounding electrode 20a to the outer edge of the dielectric sheet 1a except a location where it connects with the grounding terminal 19.

The present invention solves this conventional problem, and the high-frequency terminals 2 are provided only on the bottom side 102 of the multi-layer assembly 1 and the connections thereof are made through the via-holes which are located inwardly of and spaced from the outer edge of the dielectric sheet 1a.

Thus, the grounding electrode 20a can extend to the outer edge of the dielectric sheet 1a. Since the grounding electrode 20a is allowed to extend to the outer edge of the multi-layer assembly 1 where it is most susceptible to the external effect, the multi-layer assembly 1 can consequently be improved in the shielding effect.

Also, the high-frequency terminals 2 (i.e., antenna terminal 10a, transmission terminal 6a, and reception terminal 11a) are formed to be such as a generally "D" character shape shown in FIG. 4 that the electrode width at the outer edge of the bottom surface of the multi-layer assembly 1 is greater than that at the inner region.

This is because, when the multi-layer assembly 1 is mounted on a circuit board, it may intensively suffer at the outer edge from a stress caused by a heat shrinkage difference between the multi-layer assembly 1 and the circuit board or by any external impact. For preventing the high-frequency terminals 2 (i.e., antenna terminal 10a, transmission terminal 6a, and reception terminal 11a) from being fractured off by such a stress, the electrode width of each of the high-frequency terminals 2 is increased particularly located at the outer edge of the multi-layer assembly 1 to relieve the stress.

Simultaneously, the electrode width of each of the high-frequency terminals 2 is decreased towards the inner region of the multi-layer assembly 1 for inhibiting any undesired coupling between the high-frequency terminals 2 and the circuit electrodes in the multi-layer assembly 1 (e.g. a coupling between the high-frequency terminal 11a and the capacitor electrode 21a).

More specifically, in the conventional assembly shown in FIG. 10, the high-frequency terminals 2 extends from the bottom side to the lateral sides of the multi-layer assembly 1 and are associated with solder fillets applied during the mounting of the assembly on a circuit board. Thus, the strength against peeling-off will be increased by dispersing the external stress up to the outer edge side. Also, the ends of the high-frequency terminals 2 are not formed to extend along the outer edge of the mounting surface where the effect of the external stress is intensively high, thus increasing the strength against peeling-off in the conventional assembly.

In the present embodiment, however, as described above, the high-frequency terminals 2 of the high-frequency switching module are provided on the mounting side (i.e., bottom surface 102) of the multi-layer assembly 1 for increasing the shielding effect. Therefore, the high-frequency terminals 2 may be declined in the strength against peeling-off. It is hence essential to avoid the declination in the strength against peeling-off.

For ensuring the strength of bonding between the multi-layer assembly 1 and the circuit board, the high-frequency terminals 2 have to be increased in the connection area. Accordingly, the electrode width of each of the high-frequency terminals 2 is made greater at the outer edge of the multi-layer assembly 1 which relatively receives a higher intensity of the external stress and made, smaller at the inner region. This prescribed arrangement is an effective means for increasing the connection area.

The high-frequency terminals 2 may practically be arranged of substantially a D shape as shown in FIG. 4. This allows the electrode width to be greater at the outer edge of the multi-layer assembly 1 and smaller at the inner region. Also, since the D shape has no sharp corners along its arcuate side which the sharp corners may intensively receive the external stress, the high-frequency terminals 2 can be improved in the mounting strength.

Furthermore, in the arrangement of the high-frequency terminals 2, the high-frequency terminals 2 are spaced from the outer edge of the multi-layer assembly 1 (shown by spacings 6s, 19s and 11s in FIG. 4B) so that the strength against peeling off can be improved.

It may be a common practice that a set of large sized dielectric sheets are provided with electrode patterns and bonded one over the other to build a multi-layer block which is then sliced into desired multi-layer assemblies 1. If the high-frequency terminals 2 are not spaced from the outer edge of the multi-layer assembly 1, the electrode portions may be separated in the slicing process due to dimensional and positional variations in the electrode patterns pertinent to the printing of the patterns. Such separation of the high-frequency terminals 2 from the surface of the multi-layer assembly 1 is inhibited by locating the high-frequency terminals 2 spaced properly from the outer edge of the multi-layer assembly 1. As a result, the strength against peeling-off can be maintained at a desired level.

Still furthermore, in addition to the terminal electrodes of the high-frequency terminals 2 (i.e., antenna terminal 10a, transmission terminal 6a, and reception terminal 11a), the control terminal 13a acting as the control port 13 for controlling the turning on and off of the high-frequency switch and the grounding terminal 19a connected to the external ground may be provided on the mounting side surface 102 of the multi-layer assembly 1 as shown in FIG. 4.

Figure 5:
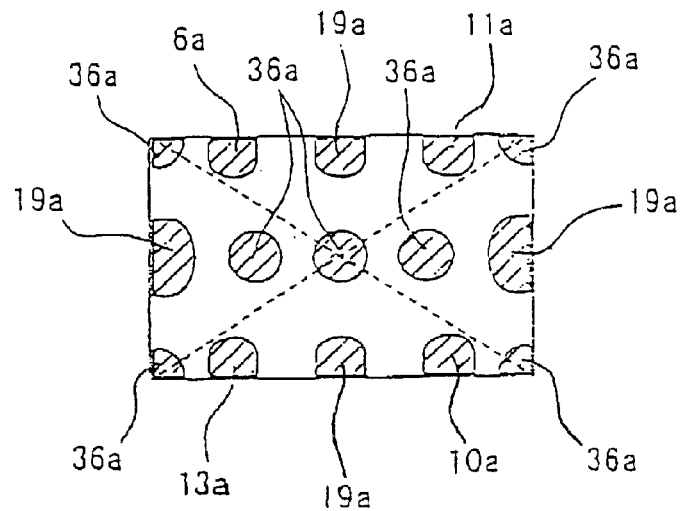
FIG. 5 is a bottom view of a high-frequency switching module according to another embodiment of the present invention.

In another preferred embodiment, as shown in FIG. 5, connection electrodes 36a may be provided on the mounting surface side 102 for connection between the multi-layer assembly 1 and the circuit board. This increase the connection area of the multi-layer assembly 1 to the circuit board, thus relieving the external stress which may be exerted on the high-frequency terminals 2 or the control terminal 13a which are essential members in the high-frequency switching module. Accordingly, the mounting performance can be improved.

Preferably, when the connection electrodes 36a are provided at corners of the mounting side surface 102 of the multi-layer assembly 1, they can protect the corners of the multi-layer assembly 1 from external intensive stress.

It may be desired in view of arrangement of the circuit board on which the multi-layer assembly 1 is mounted that the high-frequency terminals 2 and the control terminal 13a are provided at the outer edge region of the multi-layer assembly 1. As the high-frequency switching module is down-sized, the electrodes provided on the mounting side surface 102 of the multi-layer assembly 1 become smaller in size.

It is hence essential for ensuring the mounting performance to relieve the stress to be exerted on the high-frequency terminals and the control terminal. For this purpose, the described arrangement of the connection electrodes 36a separately of the other terminals (the high-frequency terminals 2, control terminal 13a, and grounding terminal 19a) can be useful to increase the connection area.

In addition, the extra connection electrodes 36a may preferably be provided at the center or at a central region in symmetrical relationship of the mounting side surface 102 of the multi-layer assembly 1. This permits the multi-layer assembly 1 to be joined to the circuit board by a reflow technique using cream solder. As having been self-aligned by reflow soldering, the high-frequency terminals 2 can be positioned at a higher degree of accuracy in relation to the lands on the circuit board to be joined. Since the soldered portions which may develop parasitic inductance in the high-frequency operation are set stable, the high-frequency apparatus equipped with the high-frequency switching module can favorably be improved in performance stability.

Also, the lands may be arranged smaller in size than the high-frequency terminals 2. This inhibits the circuit electrodes in the multi-layer assembly 1 from being coupled with the lands which serve as signal paths for high-frequency signals. Accordingly, the high-frequency switching module mounted on the circuit board can be prevented from declination in high-frequency characteristics.

Alternatively, the lands on the circuit board may be arranged of a circular shape or a rectangular shape rounded at each corner (where the radius R is preferably not smaller than 0.05 mm). This provides the edge effect, inhibiting increase of the electromagnetic field induced coupling, and hence minimizing the parasitic impedance.

The connection electrodes 36a may be provided as floating electrodes separately of the high-frequency switching module circuits shown in FIG. 2 so as to improve the surface mounting performance of the multi-layer assembly 1. Also, when the connection electrodes 36a are connected through via-holes to the grounding electrode 20a as well as the grounding terminal 19a provided at the lowermost layer of the multi-layer assembly 1, the high-frequency switching module can further be improved in grounding connection performance, thus enhancing the high-frequency characteristics.

Alternatively, the terminals for external connection including the high-frequency terminals 2 may be equipped with solder balls. This allows any high-frequency switching module having another terminal arrangement with the connection terminals 36a provided at the inner region of the mounting side surface of the multi-layer assembly 1 to be securely joined to a circuit board.

In the high-frequency switching module shown in FIGS. 2A and 2B, a fabrication method of the capacitors 18, 19 and 20 is described below where the capacitors 18, 19 and 20 are directly connected to the antenna port 10, transmission port 6, and reception port 11 respectively which the respective ports correspond to the high-frequency terminals 2 (i.e., antenna terminal 10a, transmission terminal 6a, and reception terminal 11a).

For example, the capacitor 19 connected to the transmission port 6 may be fabricated by arranging a capacitor electrode on the dielectric sheet 1a shown in FIG. 3 opposite to the transmission terminal 6a shown in FIG. 4 at a location separately from the grounding electrode 20a. By this arrangement, since the transmission terminal 6a is commonly used as the electrode for fabricating the capacitor, the multi-layer assembly 1 can be reduced in overall size. Also, the capacitors 18 and 20 may be fabricated in a similar manner.

Figure 6:
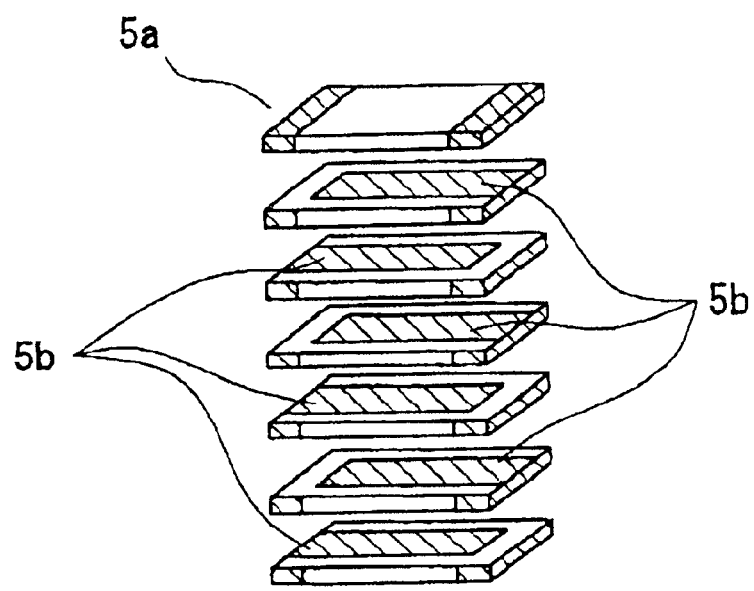
FIG. 6 is an exploded perspective view of a multi-layer capacitor used in a high-frequency switching module of another embodiment.
Figure 7:
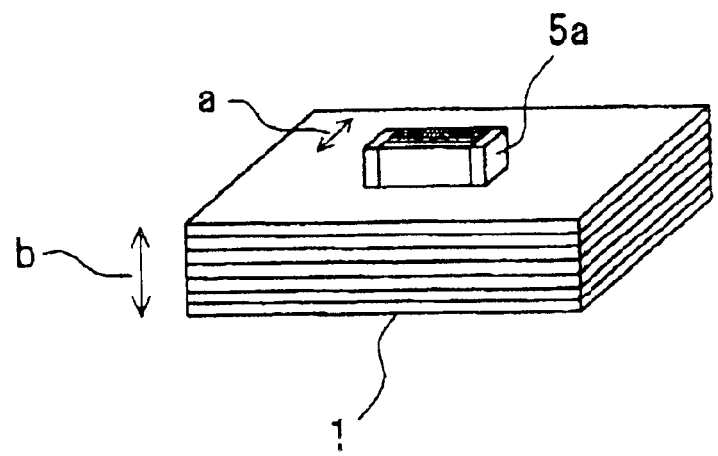
FIG. 7 is a perspective view of the high-frequency switching module using the multi-layer capacitor shown in FIG. 6.

In another preferred embodiment shown in FIGS. 6 and 7, the circuit component 5 provided on the top side 101 of the multi-layer assembly 1 may be a multi-layer capacitor. The multi-layer capacitor is fabricated as a multi-layer block 5a having capacitor electrodes 5b placed one over the other in layers, as shown in FIG. 6.

The multi-layer capacitor 5a is mounted on the top side of the multi-layer assembly 1 of the high-frequency switching module so that the direction shown by an arrow "a" of stacking layers of the multi-layer block 5a is substantially vertical to the direction "b" of stacking layers in the multi-layer assembly 1 as shown in FIG. 7.

This allows the floating capacitance developed between the capacitor electrodes 5b in the multi-layer capacitor and the patterned electrodes in the multi-layer assembly 1 to be significantly reduced, thus minimizing declination in high-frequency characteristics of the high-frequency switching module.

Figure 8:
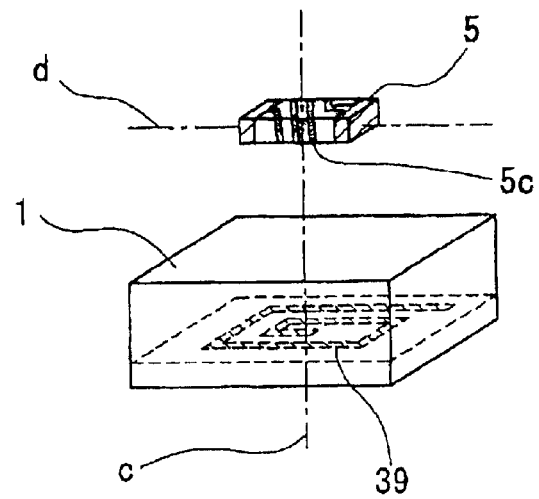
FIG. 8 is a perspective view of a high-frequency switching module according to a further embodiment of the present invention.

In further another preferred embodiment as shown in FIG. 8 where the circuit component 5 is a chip inductor, the multi-layer assembly 1 of the high-frequency switching module may include a spiral transmission path 39. The chip inductor 5 is mounted on the multi-layer assembly 1 in a direction such that the axis "d" of winding of its coil electrode 5c extends substantially vertical to the axis "c" of a spiral form of the transmission path 39.

Thus, the coupling between the spiral form and the chip inductor can significantly be attenuated. Accordingly, the high-frequency switching module can keep good high-frequency characteristics.

Figure 9:
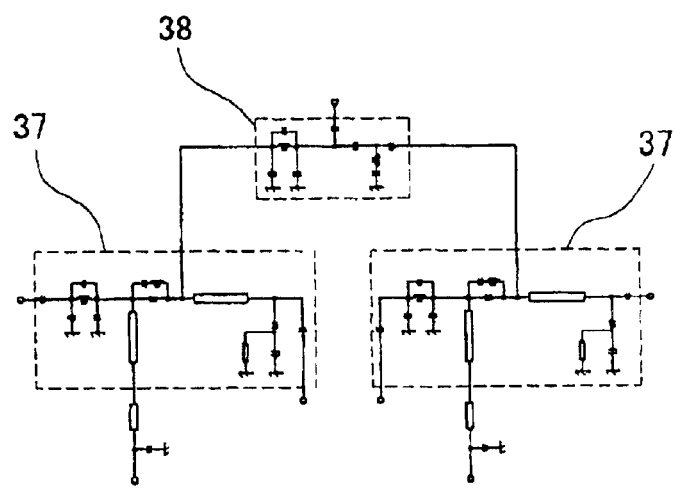
FIG. 9 is a perspective view of a high-frequency switching module according to a still further embodiment of the present invention.

While the high-frequency switching module of the embodiment shown in FIG. 2 is of an SPDT type, it may be a dual-band high-frequency switching module where a couple of SPDT type high-frequency switching modules 37 are connected in parallel with each other by a diplexer 38 as shown in FIG. 9. As the dual-band type has a multi-terminal structure, the effects as described before will further be enhanced.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A high-frequency switching module including a switching circuit and a filtering circuit, comprising:
   a multi-layer assembly having a plurality of dielectric sheets of layers placed one over another;
   a plurality of high-frequency terminals provided on outer surfaces of the multi-layer assembly;
   said switching circuit formed in the layers of said multi-layer assembly having a first end thereof connected to a first high-frequency terminal of said plurality of high-frequency terminals; and
   said filtering circuit formed in the layers of said multi-layer assembly having a first end thereof connected to a second end of said switching circuit, a second end thereof being connected to a second high-frequency terminal of said plurality of high-frequency terminals,
   wherein said plurality of high-frequency terminals are provided on a mounting side surface of said multi-layer assembly while lateral sides of said multi-layer assembly are not provided with any electrode for said high-frequency terminals, said multi-layer assembly having a rectangular four-sided outer shape and connection terminals provided at an inner region of the mounting side surface for external connection reinforcement, the connection terminals being positioned in symmetry with respect to substantially a center of the mounting side surface of the multi-layer assembly.

2. A high-frequency switching module including a switching circuit and a filtering circuit, comprising:
   a multi-layer assembly having a plurality of dielectric sheets of layers placed one over another;
   a plurality of high-frequency terminals provided on outer surfaces of the multi-layer assembly;
   said switching circuit formed in the layers of said multi-layer assembly having a first end thereof connected to a first high-frequency terminal of said plurality of high-frequency terminals; and
   said filtering circuit formed in the layers of said multi-layer assembly having a first end thereof connected to a second end of said switching circuit, a second end thereof being connected to a second high-frequency terminal of said plurality of high-frequency terminals,
   wherein a strip line which forms a part of said switching circuit and/or the filtering circuit is partially located in said multi-layer assembly while the remaining part of the strip line is located on a circuit board on which said multi-layer assembly is mounted, an impedance of the strip line located in the multi-layer assembly being smaller than an impedance of the strip line located on the circuit board, so that a total electric length is not greater than $\lambda/4$.

3. A high-frequency switching module including a switching circuit and a filtering circuit, comprising:
   a multi-layer assembly having a plurality of dielectric sheets of layers placed one over another;
   a plurality of high-frequency terminals provided on outer surfaces of the multi-layer assembly;
   said switching circuit being formed with circuit electrodes in the layers of said multi-layer assembly having a first end thereof connected to a first high-frequency terminal of said plurality of high-frequency terminals;
   said filtering circuit being formed with circuit electrodes in the layers of said multi-layer assembly having a first end thereof connected to a second end of said switching circuit, a second end thereof being connected to a second high-frequency terminal of said plurality of high-frequency terminals, wherein said plurality of high-frequency terminals are provided on a mounting side surface of said multi-layer assembly while lateral sides of said multi-layer assembly are not provided with any electrode for said high-frequency terminals; and
   a circuit board on which the high-frequency switching module is mounted, wherein
   lands provided on said circuit board are arranged smaller in size than the high-frequency terminals of said high-frequency switching module.

4. A high-frequency switching module including a switching circuit and a filtering circuit, comprising:
   a multi-layer assembly having a plurality of dielectric sheets of layers placed one over another;
   a plurality of high-frequency terminals provided on outer surfaces of the multi-layer assembly;
   said switching circuit formed in the layers of said multi-layer assembly having a first end thereof connected to a first high-frequency terminal of said plurality of high-frequency terminals; and
   said filtering circuit formed in the layers of said multi-layer assembly having a first end thereof connected to a second end of said switching circuit, a second end thereof being connected to a second high-frequency terminal of said plurality of high-frequency terminals,
   wherein said plurality of high-frequency terminals are provided on a mounting side surface of said multi-layer assembly while lateral sides of said multi-layer assembly are not provided with any electrode for said high-frequency terminals, said multi-layer assembly having a rectangular four-sided outer shape and connection terminals provided at an inner region of the mounting side surface for external connection reinforcement, the connection terminals being positioned at substantially a center of the mounting side surface of the multi-layer assembly.

5. The high-frequency switching module according to claim 4, wherein the connection terminals are positioned in symmetry with respect to substantially the center of the mounting side surface of the multi-layer assembly.

6. The high-frequency switching module including a switching circuit and a filtering circuit, comprising:
   a multi-layer assembly having a plurality of dielectric sheets of layers placed one over another;
   a plurality of high-frequency terminals provided on outer surfaces of the multi-layer assembly;
   said switching circuit formed in the layers of said multi-layer assembly having a first end thereof connected to a first high-frequency terminal of said plurality of high-frequency terminals; and
   said filtering circuit formed in the layers of said multi-layer assembly having a first end thereof connected to a second end of said switching circuit, a second end thereof being connected to a second high-frequency terminal of said plurality of high-frequency terminals,
   wherein said plurality of high-frequency terminals are provided on a mounting side surface of said multi-layer assembly while lateral sides of said multi-layer assembly are not provided with any electrode for said high-frequency terminals, the high-frequency terminals spaced by a predetermined distance from the outer edge of the multi-layer assembly.

7. The high-frequency switching module including a switching circuit and a filtering circuit, comprising:
- a multi-layer assembly having a plurality of dielectric sheets of layers placed one over another;
- a plurality of high-frequency terminals provided on outer surfaces of the multi-layer assembly;
- said switching circuit formed in the layers of said multi-layer assembly having a first end thereof connected to a first high-frequency terminal of said plurality of high-frequency terminals; and
- said filtering circuit formed in the layers of said multi-layer assembly having a first end thereof connected to a second end of said switching circuit, a second end thereof being connected to a second high-frequency terminal of said plurality of high-frequency terminals,
- wherein said plurality of high-frequency terminals are provided on a mounting side surface of said multi-layer assembly while lateral sides of said multi-layer assembly are not provided with any electrode for said high-frequency terminals, said multi-layer assembly having a rectangular four-sided outer shape and having connection terminals provided at corners of the mounting side surface thereof for external connection reinforcement.

* * * * *

UNITED STATES PATENT AND TRADEMARK OFFICE
CERTIFICATE OF CORRECTION

PATENT NO. : 6,831,528 B2
DATED : December 14, 2004
INVENTOR(S) : Y. Nagata et al.

It is certified that error appears in the above-identified patent and that said Letters Patent is hereby corrected as shown below:

Title page,
Item [56], References Cited, OTHER PUBLICATIONS, first reference, "7-205502" should be -- 7-202502 --.

Signed and Sealed this

Ninth Day of August, 2005

JON W. DUDAS
*Director of the United States Patent and Trademark Office*